United States Patent [19]
Glanz

[11] Patent Number: 6,021,738
[45] Date of Patent: Feb. 8, 2000

[54] CARRIAGE ELECTRODE CONTACT SYSTEM USED IN COATING OBJECTS BY VACUUM DEPOSIT

[75] Inventor: Richard Glanz, Sarasota, Fla.

[73] Assignee: CompuVac Systems, Inc., Sarasota, Fla.

[21] Appl. No.: 09/034,572

[22] Filed: Mar. 4, 1998

[51] Int. Cl.⁷ .................................................. C23C 16/00
[52] U.S. Cl. ............. 118/723 R; 118/50.1; 118/723 HC; 118/729
[58] Field of Search .................................. 118/50.1, 715, 118/723 R, 723 HC, 729

[56] References Cited

U.S. PATENT DOCUMENTS

| | | | |
|---|---|---|---|
| 5,647,911 | 7/1997 | Vanell et al. | 118/715 |
| 5,900,065 | 5/1999 | Liehr et al. | 118/723 HC |

*Primary Examiner*—Leo B. Tentoni
*Attorney, Agent, or Firm*—Charles J. Prescott

[57] ABSTRACT

An improved electrode contact system for metal vaporization electrodes or rods which are electrically and supportively connected to a movable carriage which also receives and supports objects such as parts and components in a vacuum chamber during metal vapor deposition. A metal such as aluminum, chromium, or nickel-chromium, etc. is vaporized centrally in the chamber by contact with electrically energized electrodes or elongated rods in a well known fashion after the chamber has been substantially evacuated of air molecules for uniform vapor deposition of the vaporized metal atop exposed surfaces of the objects. The electrode contact system provides an automatic, self-aligning plug-in assembly for each electrode rod so that, as the carriage, loaded with parts and components to be metal vapor coated is rolled into position within the vacuum chamber, each two-part contact system automatically fully engages. Vibration from carriage rotation during cleaning and vapor deposition and monomer coating will not materially affect current or voltage levels being transferred to each electrode thereby.

1 Claim, 5 Drawing Sheets

CARRIAGE ELECTRODE CONTACT SYSTEM USED IN COATING OBJECTS BY VACUUM DEPOSIT

BACKGROUND OF THE INVENTION

1. Scope of Invention

This invention relates generally to systems for coating objects by vacuum deposition, and more particularly to a self-aligning and automatically engaging conductive rod or electrode contact system associated with a moveable carriage used to support components and parts during the vacuum deposition process.

2. Prior Art

Vacuum deposition of vaporized metal and plasma-energized protective coatings onto the exterior and interior surfaces of objects such as plastic components for automobile manufacturers which require a high degree of uniformity and finish quality are well known. One major manufacturer of such equipment is F. J. Stokes Corporation.

These prior art vacuum deposition systems typically include a medium to large sized vacuum chamber, a large moveable rack or carriage for holding and supporting a plurality of objects for coating within the chamber, means for conveniently moving the loaded object support carriage into and out of the chamber, an arrangement for producing vaporized metal for depositing a first metallic layer of vaporized metal onto the surface of the objects and a source of vaporized protective liquid such as a monomer which is applied atop the vaporized metal first deposited onto the surfaces of the objects within the vacuum chamber.

The use of a plasma created within the vacuum chamber in the vicinity of the metal coated objects is also typically utilized to energize the vaporized liquid monomer and to accelerate the liquid monomer within the vacuum chamber to facilitate a uniform protective coating applied to the objects.

Applicant is aware of a number of patented prior art systems which are listed below which typically represent the state of the art in vacuum deposition.

| | |
|---|---|
| 3,086,889 | Strong |
| 3,097,113 | Welsh |
| 3,117,887 | Shepard, et al. |
| 3,518,108 | Heiss, Jr., et al. |
| 3,524,426 | Ogle, et al. |
| 3,641,973 | Shrader |
| 3,713,869 | Geffeken, et al. |
| 3,970,820 | Mahl |
| 4,173,944 | Koppl, et al. |
| 4,338,883 | Mahler |
| 4,447,374 | Tanaka |
| 4,478,174 | Ranger |
| 4,673,588 | Bringmann, et al. |
| 4,687,679 | Beale |
| 4,863,756 | Hartig, et al. |
| 5,053,243 | Schuumans, et al. |
| 5,182,000 | Atonelli, et al. |
| 5,217,749 | Denton, et al. |
| 5,312,529 | Atonelli, et al. |
| 5,340,628 | Tanisaki, et al. |
| 5,401,541 | Hodnett, III |
| 5,538,909 | Poliquin, et al. |
| 5,560,963 | Tisack |

However, for the most part, these prior art references are of limited scope and of a specialty nature, some of which utilize metal vaporizing boats for vacuum deposition of a metallic film. A portion of these references also do not depend upon or require the plasma atmosphere within the vacuum chamber in a fashion similar to that of the present invention.

Further, with respect to those vacuum deposition systems which utilize a moveable carriage or frame which is rollably moved into and out of the vacuum chamber for loading and unloading parts and components for vapor deposition, contact of the metal vaporizing electrodes or rods connected to the carriage is typically made by frictional or surface contact alone. Such a contact arrangement, while economical and simple to use, results in jerking and vibrational movement of these contacts which may reduce vapor deposition consistency. Moreover, because of the high power transfer requirement across these contacts (low voltage, high amperage) substantial power fluctuations may also occur as a result of the vibrational movement between these friction contacts.

BRIEF SUMMARY OF THE INVENTION

This invention is directed to an improved electrode contact system for metal vaporization electrodes or rods which are electrically and supportively connected to a movable carriage which also receives and supports objects such as parts and components in a vacuum chamber during metal vapor deposition. A metal such as aluminum, chromium, or nickel-chromium, etc. is vaporized centrally in the chamber by contact with electrically energized electrodes or elongated rods in a well known fashion after the chamber has been substantially evacuated of air molecules for uniform vapor deposition of the vaporized metal atop exposed surfaces of the objects. The electrode contact system provides an automatic, self-aligning plug-in assembly for each electrode rod so that, as the carriage, loaded with parts and components to be metal vapor coated is rolled into position within the vacuum chamber, each two-part contact system automatically fully engages. Vibration from carriage rotation during cleaning and vapor deposition and monomer coating will not materially affect current or voltage levels being transferred to each electrode thereby.

It is therefore an object of this invention to provide an improved metal vaporizing electrode contact system which automatically engages and disengages as a supporting parts carriage is moved into and out of a vacuum chamber used for vapor metallized coatings thereatop.

It is still another object of this invention to provide an improved electrode contact system for metal vaporizing electrode rods supported on a parts carriage within a vacuum chamber which eliminates electrical power spikes and variations due to conventional frictional electrical contact between the vacuum chamber and the electrodes.

In accordance with these and other objects which will become apparent hereinafter, the instant invention will now be described with reference to the accompanying drawings.

DETAILED DESCRIPTION OF THE INVENTION

Figure 1:
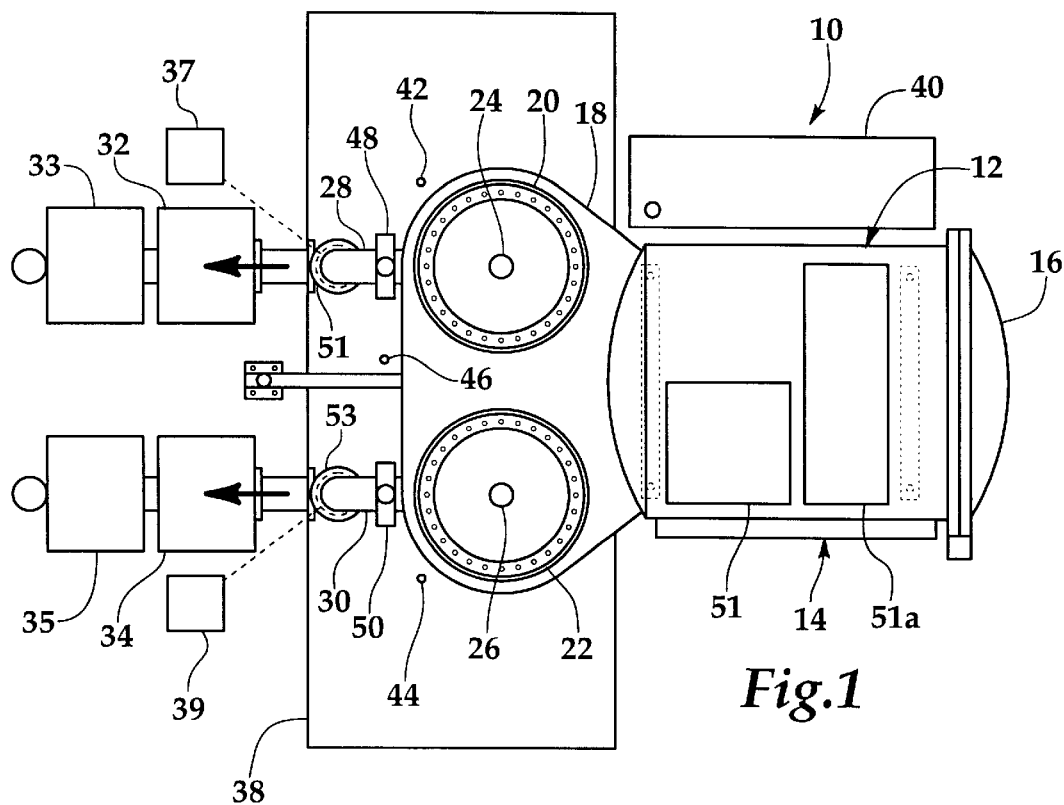
FIG. 1 is a top plan simplified schematic view of the entire apparatus of the present invention.
Figure 2:
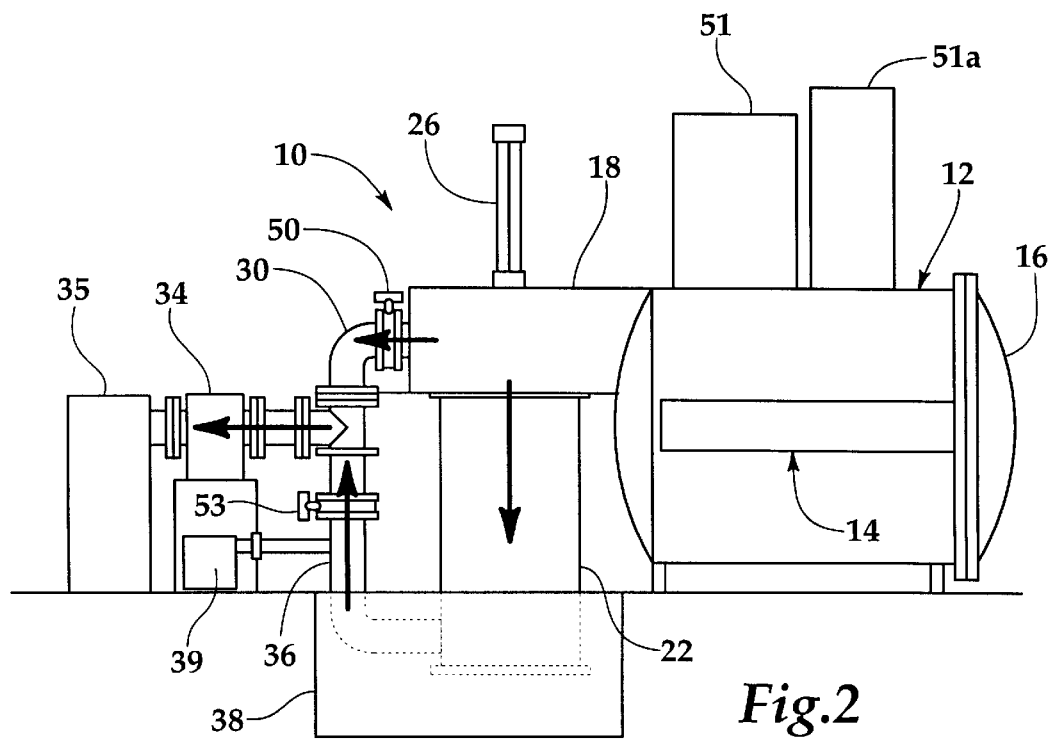
FIG. 2 is a side elevation view of FIG. 1.
Figure 3:
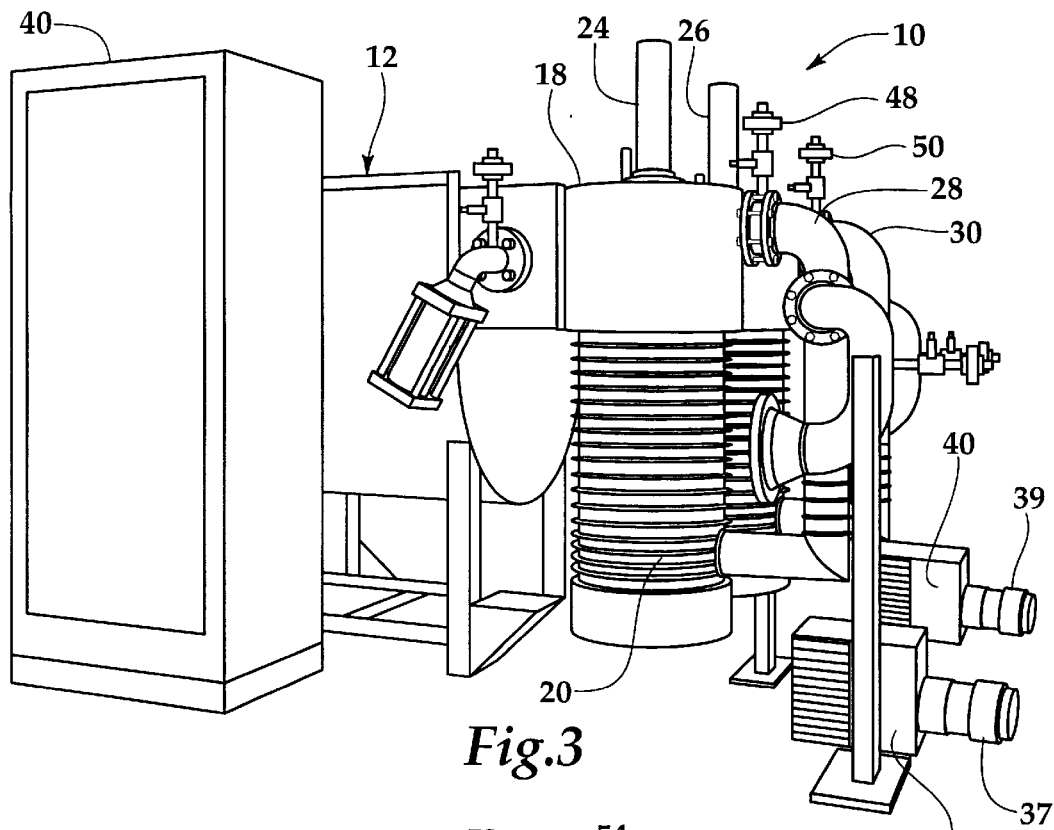
FIG. 3 is a perspective view of FIG. 1 absent some components for clarity.

Referring now to the drawings, and particularly to FIGS. 1 to 3, a metal vaporizing vacuum deposition apparatus is shown generally at numeral 10 and includes a vacuum chamber 12 having a polymerization gun assembly 14 attached to a side of the vacuum chamber 12. The system 10 also includes a plenum 18 which extends horizontally from one end of the vacuum chamber 12. The plenum 18 is connected above dual water cooled diffusion pumps 20 and 22, preferably the Varian NHS-35" diffusion pumps. Hi-Vac cylinders 24 and 26 serve to open the diffusion pumps 20 and 22 which generally serve as a second stage of vacuum chamber 12 drawdown. Water coolant into the system is connected at 42 and 44, while an air supply for the system is connected at 46.

During the initial vacuum draw down stage, valves 48 and 50 are opened and the twin mechanical pumps 33 and 35 and blower pumps 32 and 34 provide a viscous flow for vacuum drawdown through manifolds 28 and 30. During the second stage of vacuum drawdown, valves 48 and 50 are closed and valves 51 and 53 are opened to allow the diffusion pumps 20 and 22 to provide molecular flow for final vacuum drawdown. The molecular flow produced by the diffusion pumps 20 and 22 flows through manifolds 36 discharging through pumps 33 and 35 and 32 and 34. A pit 38 is provided for receiving the lower portion of the diffusion pumps 20 and 22 so as to facilitate the horizontal orientation of the plenum chamber 18 for more advantageous evacuation of the vacuum chamber 12.

Holding pumps 37 and 39 are provided to protect the diffusion pumps 20 and 22 when the system 10 is open and idle. A polycold pump 51 by Polycold Systems International for evacuating water molecules from the vacuum chamber 12 is also provided. The firing transformer in housing 51a is required for vaporizing the sacrificial evaporant positioned in the center of the carriage (described herebelow). A control housing 40 contains the control circuitry and components required to sequentially operate the system 10.

Figure 4:
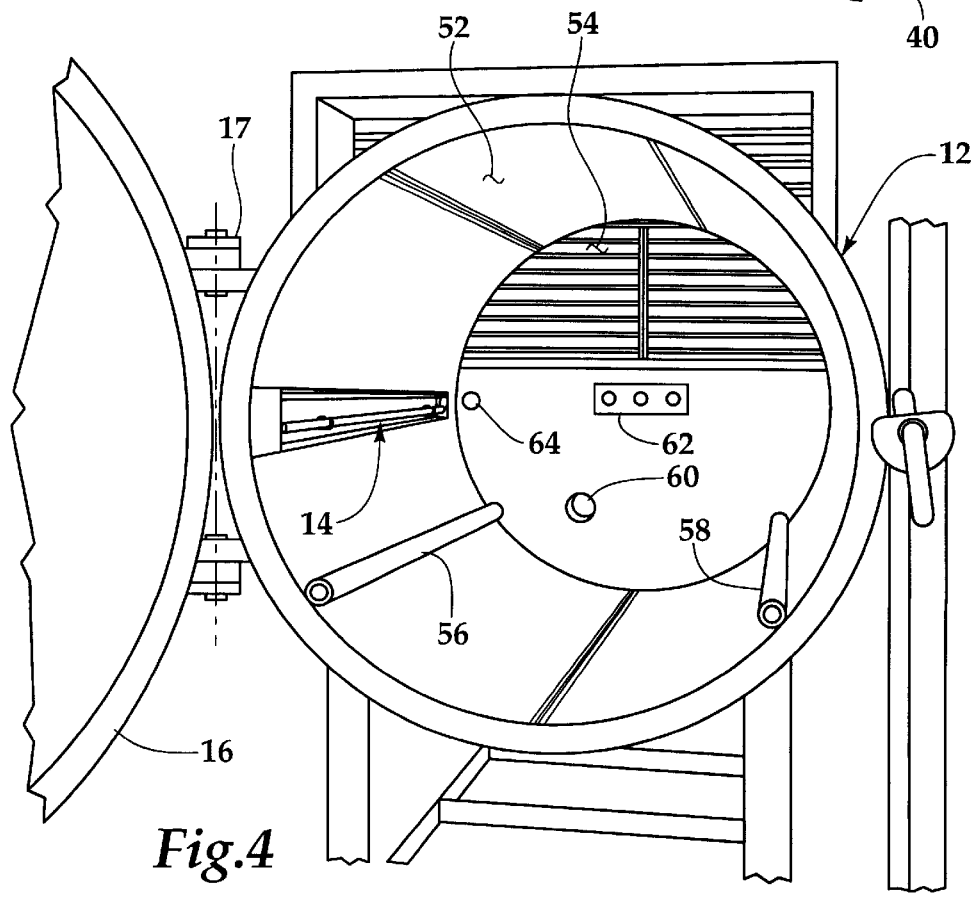
FIG. 4 is a perspective view of the vacuum chamber of FIG. 1 in an open, ready-to-load configuration.

Referring now to FIG. 4, many of the details of the vacuum chamber 12 are there shown and in subsequent figures described herebelow. The vacuum chamber 12 is generally constructed of mild steel having a diameter typically of 72" (which may range from 24" to 72") and an overall chamber length of 82" (which may range from 36" to 104"). Panels of thin stainless steel shown typically at 52 line the inner cylindrical surface of the vacuum chamber 12 to prevent vaporized metal buildup and are easily replaceable for cleaning. The vacuum chamber 12 is evacuated through grill 54 which is in fluid communication with the plenum chamber 18 as previously described.

A mild steel dome-shaped door 16 pivotally connected at 17 to the one end of the vacuum chamber 12 is sealably closeable onto the open end of the vacuum chamber 12 and is also protectively covered by removable thin stainless steel panels and further includes one or two transparent viewing parts through which the vacuum deposition process may be observed.

Figure 5:
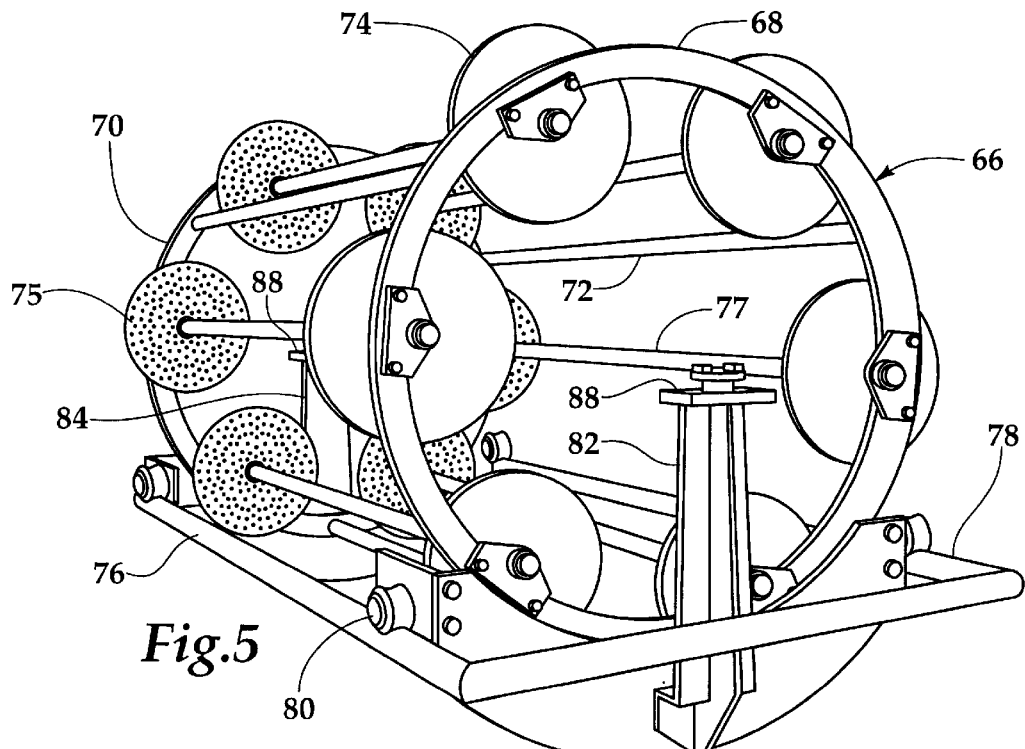
FIG. 5 is a perspective view of a planetary object support carriage for supporting objects to be loaded into and coated within the vacuum chamber.

The vacuum chamber 12 is adapted to include longitudinally extending parallel and generally horizontally oriented rails 56 and 58. These rails 56 and 58 are spaced apart and adapted to supportively rollably receive a moveable parts and component carriage 66 as seen in FIG. 5. This carriage 66, including rollers 80 at each corner thereof operably connected to a base 81 and supported and rollable on support members 76 and 78 facilitate the easy deployment of the carriage 66 into and out of the vacuum chamber 12. Rails 56 and 58, being spaced apart identical to support members 76 and 78 facilitates rolling transfer of the carriage 66.

Figure 6:
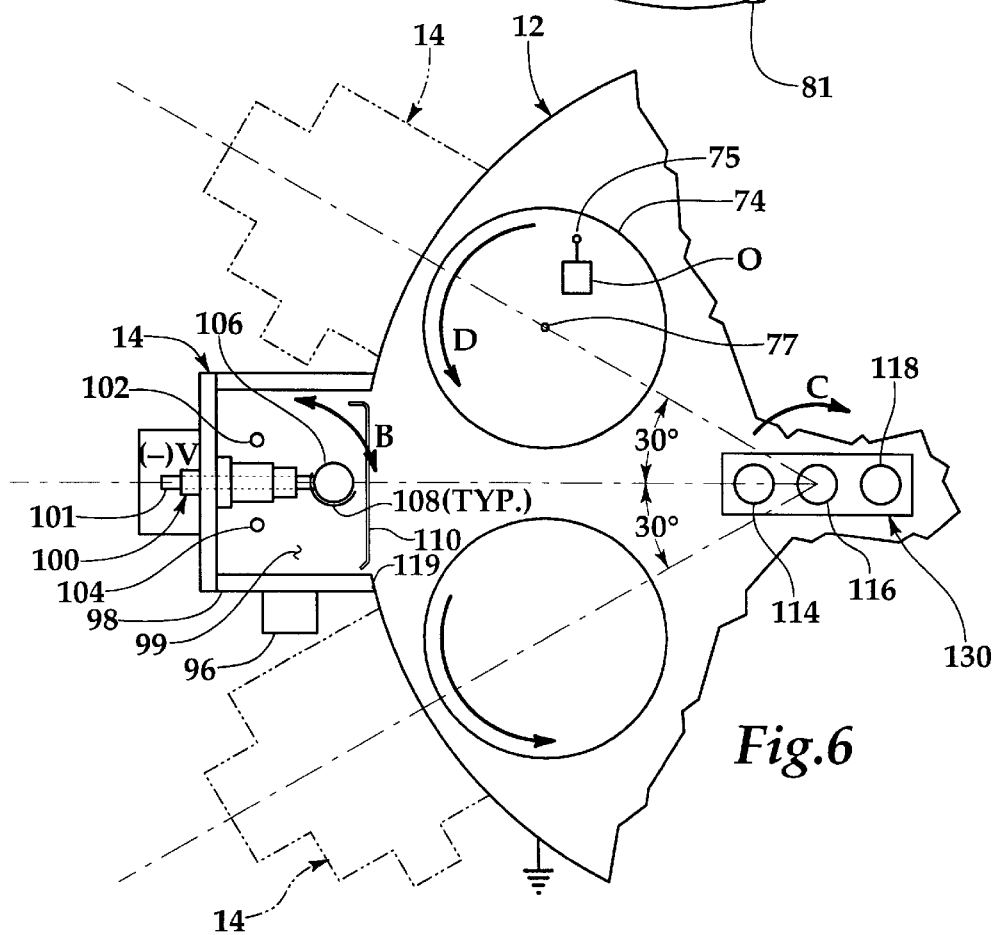
FIG. 6 is a front elevation simplified schematic view of a portion of the rear and side wall of the vacuum chamber and a polymerization gun showing alternate positioning of a dual polymerization gun arrangement.

The carriage 66 includes a plurality of apertured reels 74 mounted for rotation on circular frame members 68 and 70, pairs of these reels being interconnected by a longitudinal connecting shaft 72. As best seen in FIG. 6, the circular frames 68 and 70 (not shown in FIG. 6) rotate in the direction of arrow C, while each of the pairs of reels 74 on shaft 77 rotate oppositely in the direction of arrows D. By this arrangement, the carriage 66, using both longitudinal shafts 77 and the apertures provided in each of the reels 74, will supportively receive objects to be hung therefrom for vacuum deposition of coatings within the vacuum chamber.

The carriage 66 also includes upright supports 82 and 84 which include electrical contacts 88 to supportively receive one or more elongated solid copper conductive electrode bars 160, 162 and 164 supported thereon and therebetween. These electrode bars shown schematically in a two-electrode arrangement at 114 and 116 in FIG. 7 and, in a three-electrode arrangement at 160, 162, and 164 in FIG. 11, serve to carry the current and voltage required to vaporize a plurality of small pieces of sacrificial aluminum canes shown typically at 120, 166 and 170 held within tungsten heating coils 122, 168 and 172, respectively. Typically, between ten and fifteen of these aluminum sacrificial canes 120 are positioned along the length of, and between the copper conductive bars 114, 116, 118 or 160, 162, and 164, respectively as required based upon the volume of vaporized metal such as aluminum required to coat all of the objects being hung from the carriage 66. In the three-conductive rod arrangement in FIG. 11, two separate vaporized coatings are sequentially applied.

Figure 7:
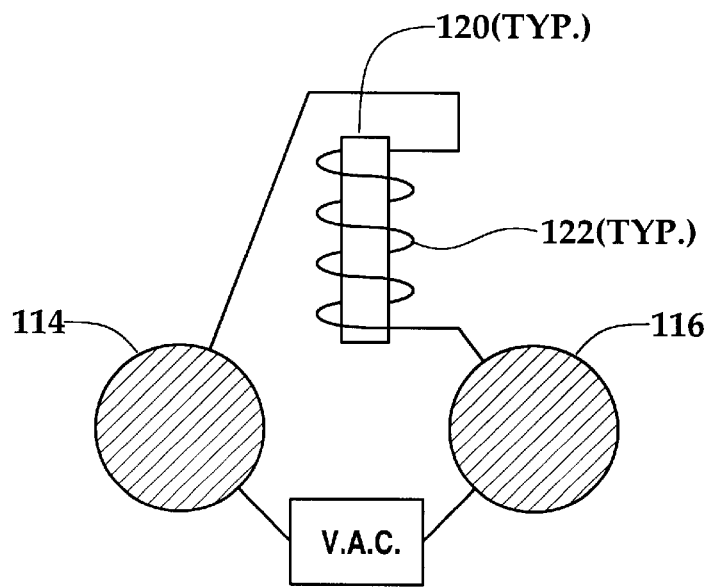
FIG. 7 is an enlarged view of the central portion of the planetary object carriage shown in FIG. 6 and depicting a typical metal vaporization arrangement.
Figure 11:
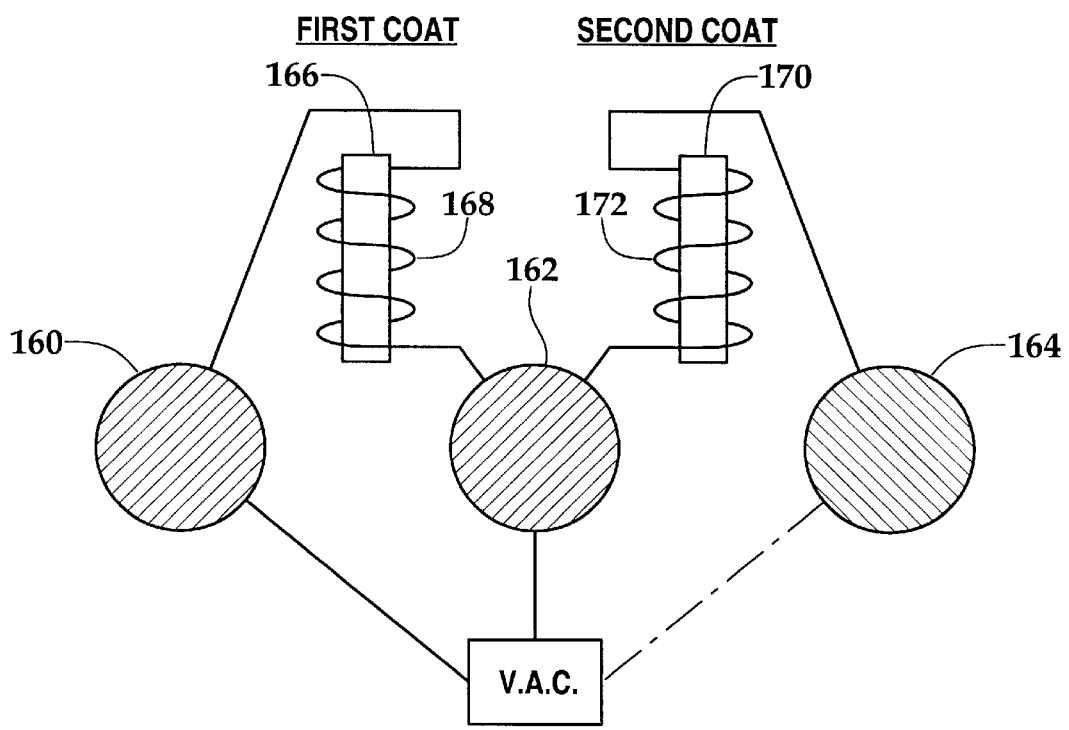
FIG. 11 is an enlarged view of the central portion of the planetary object carriage shown in FIG. 6 for a three metal vaporizing electrode arrangement.

Upon rollable positioning of the carriage 66 loaded with objects to be coated into the vacuum chamber 12, the ends of the electrode rods 114 and 116 in FIG. 7 and, where required, a three-electrode arrangement rod 160/162/164 as shown in FIG. 11, automatically interconnect with electrode contact assembly 130 described herebelow. By this arrangement, no additional electrical conduit or connectors or the like are required to make full electrical connection between the firing transformer housing 51a and the conductive electrode.

Within the housing 98 of the polymerization gun 14 are positioned a longitudinally extending 1" diameter aluminum plasma conductor rod 106 supported within spaced conductive supports 108 (typ.) by which, in turn, are in electrical contact with, and supported by, a high current high voltage feed thru fitting 100. The source utilized for this feed thru fitting 100 is CHA Industries of Freemont, Calif. under P/N FT 58009. This feed thru fitting 100 is connected to the back surface of housing 98 as shown in FIG. 11, the insulated conductor 101 connected to a negative voltage source. The vacuum chamber 12 itself is grounded to the positive (+) side of this voltage source.

As best seen in FIG. 6, the polymerization gun 14 also includes two longitudinally extending hollow fluid delivery tubes, a liquid monomer delivery tube 104 and typically an argon gas delivery tube 102. Each of these delivery tubes 102 and 104 include spaced apart apertures or nozzles 103 and 105, respectively for fluid discharge therefrom, the fluid being drawn from the nozzles 103 and 105 by the vacuum environment within the vacuum chamber 12 when occurring during each operation cycle.

A coating thickness monitor 64 is disposed at the end of the vacuum chamber 12 to monitor and control the uniform thickness of coatings being deposited upon the objects O positioned within the vacuum chamber 12. The preferred coating thickness monitor 64 sensing is supplied by Inficon, XTC-2 thickness controller. Utilizing a quartz crystal to sense the coating deposit rate and thickness, a feedback signal is provided to an external computer circuit to perform a closed loop control function of the evaporation.

Control System

An Allen Bradley SLC 503 microprocessor with analog input module for built-in vacuum gages includes analog input and output computer cards for all components along with a thermo-couple card for temperature monitoring of pumps. Allen Bradley Panel View 900 touch screen allows access to all process functions at the touch of the screen. Components are installed into the control panel 40 along with other appropriate control, alarm and warning signals in keeping with the strict stands for this type of system.

Sequence of Operation

The process of the present invention as above described includes three general steps as a preferred method of operation. After the carriage 66 has been loaded with the objects O to be coated and positioned within the vacuum chamber 12, the domed door 16 is sealingly closed and the vacuum pumping arrangement above described is then activated to substantially evacuate the air and water molecules within the vacuum chamber down to a residual air pressure of about $10^{-1}$ to $10^{-2}$ TORR.

Ion Discharge Cleaning

Voltage of approximately 2,000 volts is applied between the aluminum conductive rod 106 and the vacuum chamber 12 itself. This establishes a plasma glow discharge within the chamber 12 which emanates from the conductive rod 106. With the shutter 110 in the open position, a supply of typically argon gas is supplied at 92 and drawn into the argon discharge tube 103 which exits into the cavity 99 and passes into the vacuum chamber 12 through the plasma glow surrounding conductive rod 106. The argon is energized and absorbs energy from the plasma glow and the ionized argon is accelerated in all directions within the vacuum chamber 12 to strike the exterior surfaces of the objects O within the vacuum chamber 12 to effect surface ion cleaning. The process lasts approximately seventy seconds.

Evaporation Phase

The vacuum level within the vacuum chamber 12 is reduced to down to a level of $10^{-4}$ to $10^{-6}$ TORR. At this point, a high current, low voltage potential is established between the electrode rods of about 15 V @ 3300 amps. This produces a direct resistance heating of the tungsten filaments shown typically at 122 in FIG. 7 and at 168 and 172 in FIG. 11. The aluminum sacrificial canes 120 and 168/172 are thus heated sufficiently to become vaporized at a temperature which significantly exceeds the vapor pressure in the chamber. Heated, metallized aluminum vapor is uniformly deposited onto the ion cleaned exterior surfaces of the objects O. This phase of the operation takes approximately 70 seconds. Note that shutter 110 is in the closed position so as to substantially prevent the vaporized aluminum from entering into cavity 99 and being deposited on any of the above-described components therein. Additionally, aluminum foil wrapping around conductive rod 106 prevents any build-up of the monomer on the conductive rod 106.

Protective Coating

The vacuum chamber 12 is then adjusted in vacuum level back to approximately $10^{-2}$ TORR. The shutter 110 as placed in the open configuration, a high voltage low current potential between the conductive rod 112 and the vacuum chamber 12 is again applied to create a plasma glow emanating from conductive rod 106. A supply of liquid monomer of any siloxane family, but typically hexamethyl disiloxane, to be drawn through feed line 94 in FIG. 6 into the monomer discharge 104 and into cavity 99 as a vapor. This monomer vapor then passes through the plasma glow produced around conductive rod 106, the monomer vapor, being close to the plasma source, is strongly energized and crosslinked and finally deposited and polymerized onto the exterior surfaces of the metallized objects. This third phase of the production cycle lasts about 3 to 6 minutes.

Because the vaporized monomer must first pass through the plasma glow created by conductive rod 106 before entering the chamber 12 and before contact with any of the objects O within the vacuum chamber 12, a significantly more uniform and durable polymerization and protective coating thickness deposited onto the exterior metallized surfaces of the object O achieved.

Referring again to FIG. 6, for enhanced and even more uniform deposit of polymerized monomer protective coating onto the exterior metallized surfaces of the objects O, two polymerization guns 14 (shown in phantom), angularly spaced apart about 38 degrees about the central longitudinal axis of the vacuum chamber 12 are preferred. This orientation may also substantially equal to the angular spacing between adjacent reels 74 (typ.) but may vary between about 10° and 45°. Timing of rotation is such that, as all of the reels 74 are rotated as a unit in the direction of arrow C, while each reel 74 rotates approximately through 180 degrees in the direction of arrow D as it passes each of the two spaced polymerization guns 14. By this arrangement, objects hung on each of the reels 74 are exposed to a full revolution of monomer vapor emanating from each of the polymerization guns 14 as previously described.

Referring now to FIGS. 8 to 11, the preferred and improved embodiment of the self-aligning and automatically engaging conductive rod contact system is generally shown at numeral 130, each of the individual contact assemblies being shown generally typically at numeral 132. This triple contact assembly 130, adapted for the three conductive rod assemblies as shown in FIG. 11, is positioned within the vacuum chamber 12 as best seen in FIG. 4.

In general, each contact assembly 130 provides for the automatic and self-aligning electrical interengagement between each of the conductive rods 160, 162 and 164 which are supportively held on the electrical contact plate 88 shown in FIG. 5. Each of these contact plates 88 disposed at each end of the carriage 66 are supported on upright supports 82 and 84 as previously described.

Figure 8:
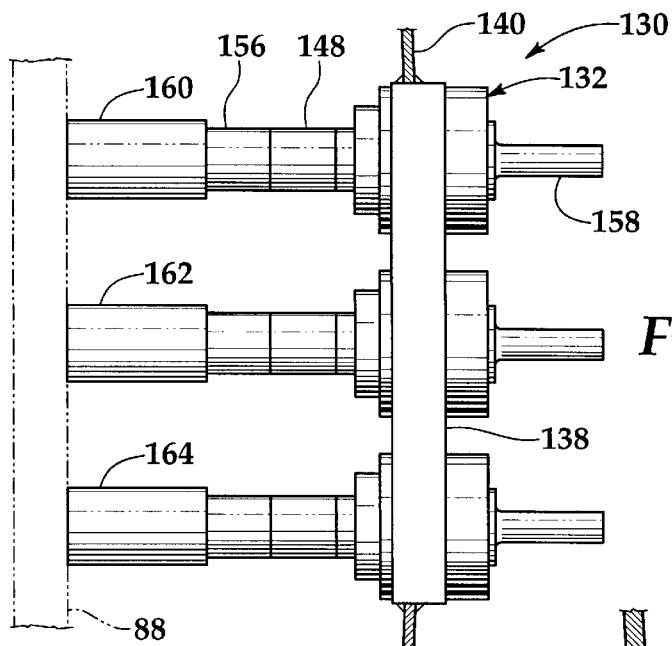
FIG. 8 is a simplified top plan view of the invention adapted for a three-metal vaporizing electrode rod arrangement.

Each of the conductive rods 160, 162 and 164 are positionally held spaced apart a predetermined and repeatable distance on support contacts 88 which provides one aspect of self-alignment by the repeatable positioning of the ends of the conductive rods 160, 162 and 164 with respect to the carriage as best seen in FIG. 8. The carriage 66 itself is consistently and repeatably precisely positioned both vertically and laterally within the vacuum chamber 12 as provided by support rollers shown typically at 80 on rails 76 and 78 positioned outside of the vacuum chamber 12 for parts loading and then on rails 56 and 58 connected to the interior of the vacuum chamber as previously described.

Figure 9:
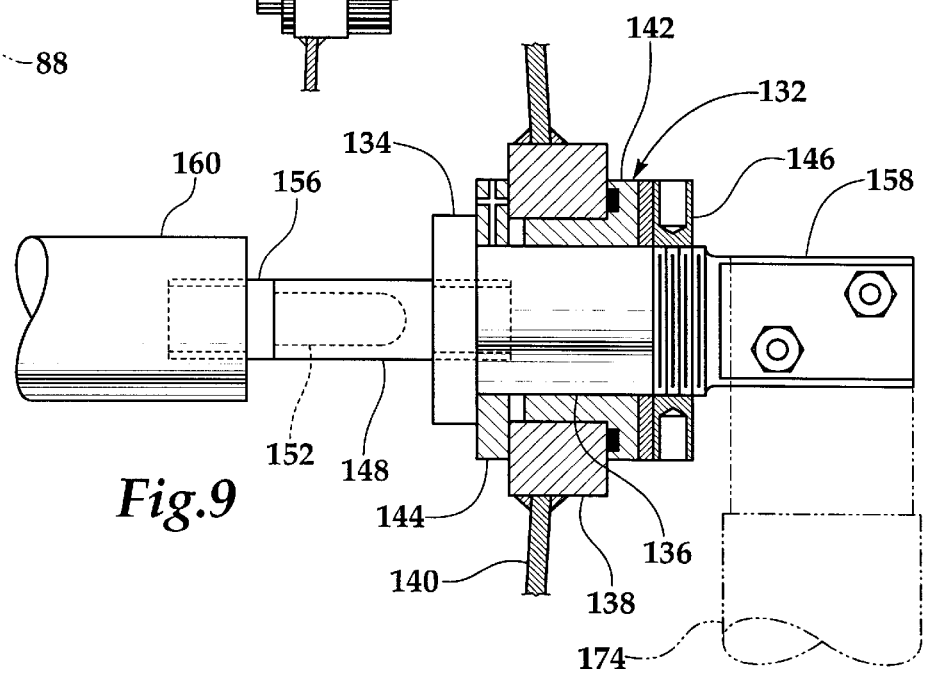
FIG. 9 is an enlarged partial section view of one of the electrode assemblies (132) of FIG. 8.
Figure 10:
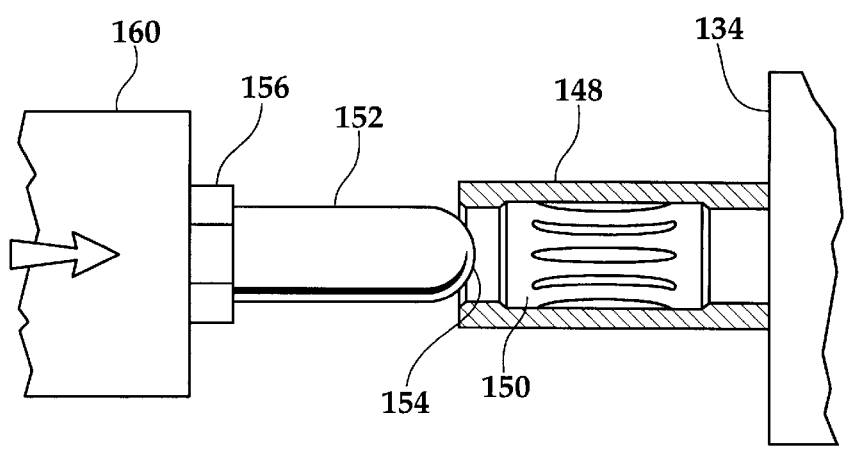
FIG. 10 is a further enlarged view of the two-part mateing electrical contact system of FIG. 9 just prior to self-aligning engagement.

As best seen in FIGS. 9 and 10, each of the conductive electrode rod contact assemblies 132 includes a male jack 152 threadably engaged into the end of each of the conductive rods 160, 162 and 164 and tightened in this position by jam nut 56. The distal end of the male jack 152 is spherically radiused to assist in automatic self-alignment.

The mateing female jack 148 of each connector assembly 132 is threadably engaged into a metallic, preferably copper lead-thru fitting 136 which is supported within an electrically isolating bushing 142 which, in turn, is supported within a lead-thru block 138 permanently secured as by welding into the vacuum chamber back panel 140. The lead-thru fitting 136 is held in position lengthwise along its longitudinal axis between an enlarged head 134 at one end thereof and a retaining collar 146 threadably engaged at a mid portion thereof.

The female jack 148 includes an expandable lengthwise slitted metallic tubular member 150 which biasingly engages inwardly against the male jack 152 to eliminate any possibility of vibration or movement which could be detrimental to the overall electrical contact therebetween.

The external end 158 of the thru-jack 136 is in the shape of a flattened blade for boltable connection with a water-cooled electrical cable 174 for interconnection to a suitable power supply as previously described.

By this arrangement, as seen in FIG. 10, as each of the male jacks 152 move toward the female jack 148 in the direction of the arrow as the loaded carriage 66 is rolled into the vacuum chamber, each of the male jacks 152, aided by their spherical distal ends 154 reliably and accurately self-align into the female jack 148 and into biasing engagement with the inner spring collar 150.

While the instant invention has been shown and described herein in what are conceived to be the most practical and preferred embodiments, it is recognized that departures may be made therefrom within the scope of the invention, which is therefore not to be limited to the details disclosed herein, but is to be afforded the full scope of the claims so as to embrace any and all equivalent apparatus and articles.

What is claimed is:

1. In an apparatus for vaporized metal coating of objects by vacuum deposition including a vacuum chamber, means for establishing a vacuum in said chamber, carriage means moveable into and from said chamber for supporting the objects within said chamber, said movable carriage means also for receiving alignment and support from spaced apart guide rails connected to an interior surface of said chamber, elongated conductive electrode bar means supported on said moveable carriage means for vaporizing a metal in electrical communication with said conductive bar means within said chamber for deposit onto substantially all exposed surfaces of the objects, the improvement comprising:

mateing male and female conductors, said male conductor electrically and supportively connected to one end of said electrode bar means, said female conductor supportively connected to and electrically isolated from a rear wall of said chamber;

said male and female conductors structured for self-aligning and automatic substantially full connection one to another when said moveable carriage means is substantially fully positioned into said vacuum chamber.

* * * * *